US009523910B2

(12) United States Patent
Pauliac et al.

(10) Patent No.: US 9,523,910 B2
(45) Date of Patent: Dec. 20, 2016

(54) NANOIMPRINT LITHOGRAPHY

(75) Inventors: Sebastien Pauliac, Grenoble (FR); Stefan Landis, Voiron (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 883 days.

(21) Appl. No.: 13/699,996

(22) PCT Filed: May 26, 2011

(86) PCT No.: PCT/EP2011/058697
§ 371 (c)(1),
(2), (4) Date: Apr. 3, 2013

(87) PCT Pub. No.: WO2011/147948
PCT Pub. Date: Dec. 1, 2011

(65) Prior Publication Data
US 2013/0187312 A1  Jul. 25, 2013

(30) Foreign Application Priority Data
May 28, 2010 (FR) ..................... 10 54169

(51) Int. Cl.
*G03F 7/00* (2006.01)
*B82Y 10/00* (2011.01)
*B82Y 40/00* (2011.01)

(52) U.S. Cl.
CPC .............. *G03F 7/0002* (2013.01); *B82Y 10/00* (2013.01); *B82Y 40/00* (2013.01); *Y10T 428/24802* (2015.01)

(58) Field of Classification Search
CPC ........ B82Y 10/00; B82Y 40/00; G03F 7/0002; Y10T 428/24802

(Continued)

(56) References Cited

U.S. PATENT DOCUMENTS 6,569,575 B1 * 5/2003 Biebuyck .............. G03F 7/2002
430/22
2006/0292487 A1  12/2006 Kwon et al.
(Continued)

FOREIGN PATENT DOCUMENTS

JP    2004 304097    10/2004
WO   2005 029179    3/2005
WO   2010 048988    5/2010

OTHER PUBLICATIONS

Cheng, X., et al., "A combined-nanoimprint-and-photolithography patterning technique," Microelectronic Engineering, vol. 71, pp. 277 to 282, (2004) XP 002616560.
Chou, S., et al., "Imprint of sub-25 nm vias and trenches in polymers," Appl. Phys. Lett., vol. 67, No. 21, pp. 3114 to 3116, (Nov. 20, 1995).
Chou, S., et al., "Imprint Lithography with 25-Nanometer Resolution," Science, vol. 272, pp. 85 to 87, (Apr. 5, 1996).
(Continued)

*Primary Examiner* — Robert J Grun
(74) *Attorney, Agent, or Firm* — Oblon, McClelland, Maier & Neustadt, L.L.P.

(57) ABSTRACT

The present invention relates to a nanoimprint lithography method. Said nanoimprint lithography method comprises: a preparation step during which a resin (120) is placed on a substrate (130); a step of pressing a mold (200, 300, 400, 500), comprising raised patterns (202), in order to transfer the raised patterns (202) of the mold (200, 300, 400, 500) into the resin (120) so as to form designs (230) therein, which each have at least one end; and a removal step for separating the mold (200, 300, 400, 500) from the resin (120), characterized in that the resin (120) is a positive photosensitive resin, in that it includes an exposure step for activating the resin (120) before or after the step of removing the mold (200, 300, 400, 500), and in that it includes, prior to the exposure step, a masking step during which a mask coating (110, 310), partially stopping at least the exposure of the resin (120) that it covers and only covering the resin (Continued)

Figure 1:
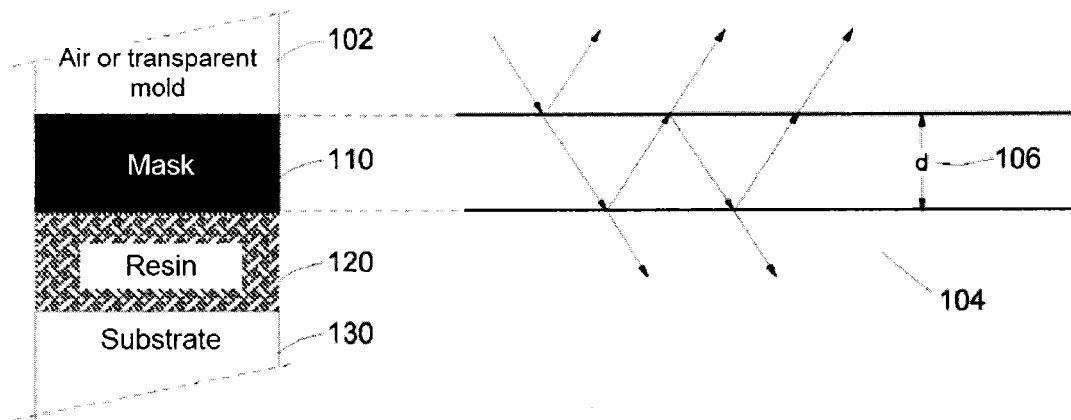

(120) outside the end of the designs (230), is placed between the mold (200, 300, 400, 500) and the resin (120).

6 Claims, 7 Drawing Sheets

(58) Field of Classification Search
USPC .................................................. 264/319, 447
See application file for complete search history.

(56) References Cited

U.S. PATENT DOCUMENTS

| | | |
|---|---|---|
| 2007/0099323 A1 | 5/2007 | Chang et al. |
| 2009/0189317 A1 | 7/2009 | Sato et al. |
| 2010/0072675 A1 | 3/2010 | Cho et al. |

OTHER PUBLICATIONS

Stutzmann, N., et al., "Patterning of polymer-supported metal films by microcutting," Letters to Nature, vol. 407, (Oct. 5, 2000).

Chou, S., et al., "Imprint Lithography with Sub-10 nm Feature Size and High Throughput," Microelectronic Engineering, vol. 35, pp. 237 to 240, (1997).

Chou, S., et al., "Nanoimprint lithography," J. Vac. Sci. Technol., vol. B 14, No. 6, pp. 4129 to 4133, (Nov./Dec. 1996).

Park, H., et al., "Thermoplastic polymer patterning without residual layer by advanced nanoimprinting schemes," Nanotechnology, vol. 20, pp. 1 to 7, (2009).

International Search Report Issued Jul. 7, 2011 in PCT/EP11/058697 filed May 26, 2011.

* cited by examiner

Mold Type A

Mold Type B

Mold Type C

NANOIMPRINT LITHOGRAPHY

The present invention relates to lithography for the manufacture of integrated circuits in general and more particularly to an improved nanoimprint lithography method.

The industrial manufacture of new generations of integrated circuits entails being able to etch patterns of ever smaller size, now measured in nanometers (nm=$10^{-9}$ meters). However, the photolithography used since the beginning, based on irradiation of photosensitive resins through optical masks reproducing the patterns to be etched comes up against physical barriers, which make it necessary to resort to increasingly sophisticated techniques in order to match the growth of the desired integration density. In particular, in order to limit light diffraction through the masks, it is necessary to resort to shorter wavelengths (ultraviolet, even x-rays) and to all kinds of techniques (for example, liquid immersion lithography), which require considerable investments for their development and their industrial employment.

In the mid-nineteen nineties, however, a very different technique, which makes it possible in particular to become completely free of the aforesaid diffraction problems, was invented by Professor Stephen Y. CHOU and his collaborators, then working at the University of Minnesota in the United States. Its principle was disclosed in an article entitled "Imprint of sub-25 nm vias and trenches in polymers", published in "Appl. Phys. Lett. 67 (21)", dated 20 Nov. 1995 and coauthored by Peter R. Krauss and Preston J. Renstrom. From that time on, this technique, better known by its general English name of "nanoimprint lithography", in other words lithography by nanometric imprinting, was part of the international road map of technologies for semiconductors or ITRS, for "international technology roadmap for semiconductors". And more particularly for the integrated circuit technologies in the course of development or in the industrialization phase, where the basic functional element, the node, has successively been defined as 32 nm and 22 nm by the road map.

Nanoimprint lithography comprises two principal techniques. The first, that proposed originally by Professor Chou, known as T-NIL, from the English for "thermal nanoimprint lithography", in other words lithography by thermal nanometric imprinting, consists in imprinting heated thermoplastic monomers or polymers with an opaque mold. After cooling, the mold can be removed leaving the imprinted patterns in place. This technique is very simple to employ, but the patterns created in this way are not directly transferable into the material or materials to be etched. For this purpose it is also necessary to perform an etching known as RIE from the English "reactive ion etching", in other words reactive ionic etching in the presence of oxygen in order to remove the residues of monomers or polymers still present at the bottom of the nanoimprinted trenches. Another approach consists in performing etching steps, in the course of which a controlled thickness of material is removed by chemical methods.

The second technique, designated P-NIL, consists in imprinting a photosensitive resin with a transparent mold and performing optical irradiation of the resin film through it. The irradiation causes cross-linking of the resin film, which solidifies. As in the foregoing, the mold can then be removed. This technique also leaves a residue at the bottom of the nanoimprinted patterns, which residue must be removed to permit transfer of the patterns onto the substrate to be etched.

Nanoimprint lithography is a very advantageous technique for the entire microelectronics industry. It makes it possible to reproduce patterns of nanometric size effectively, for example on the entire surface of silicon wafers used by this industry to produce integrated circuits in large quantities, with low operating cost. Its main disadvantage is, as indicated hereinabove for standard resins, the presence of residues after imprinting on all of the surfaces that have been compressed.

The object of the invention is therefore to provide a solution to this problem.

The invention describes a nanoimprint lithography method that includes a step of preparation, in the course of which a resin is disposed on a substrate, a step of pressing of a mold containing reliefs so as to transfer the reliefs from the mold into the resin to form patterns therein, a step of stripping to separate the mold from the resin, a step of irradiation to activate the resin, the said irradiation step being performed before or after the step of stripping of the mold. The resin is a positive photosensitive resin. This method additionally comprises, before or after the step of stripping of the mold, a step of exposure to activate the resin. It also comprises, prior to the exposure step, a step of masking, in the course of which a masking coating that partly stops at least the exposure of the resin that it covers is disposed between the mold and the resin, the masking coating covering the resin outside the ends of the patterns.

Preferably, at least during the exposure step, the masking coating leaves at least the end of the patterns uncovered and covers all the resin situated outside the patterns. Preferably, at least during the exposure step, the masking coating covers at least part of the sidewalls of the patterns.

In this way the masking coating covers the resin on the zones that do not constitute a pattern and leaves the resin uncovered on the patterns, at least at their ends.

Consequently, during the irradiation step, the zone not covered by the masking coating is irradiated. The resin left uncovered is then activated. It may be developed without leaving residues remaining in the bottom of the patterns. Consequently the invention makes it possible to make these residues disappear without resorting to a step of the reactive ion etching type (RIE).

By positive resin there is understood a resin based on a matrix of polymers containing at least one photogenerator of acids, generally known by the name PAG for its English name photo acid generator. During irradiation, the PAG releases acids which break the bonds between the polymers, thus permitting development of the resin.

The invention may be achieved in particular with the standard positive resins used in microelectronics, in photolithography, for example positive (non-liquid) resins with chemical amplification. The irradiation may take place on the scale of a slice, also known as wafer, in other words collectively over the entire wafer, thus limiting its cost.

The method according to the invention also has the advantage of reducing the risks of formation of feet in the bottom of the patterns obtained in the resin. Foot is the term for an angle of resin that remains in undesired manner in the bottom of a pattern. The higher the resolution, the more the feet deform the desired patterns. With the method according to the invention, the irradiation tends to be greater, as a result of diffusion and/or diffraction phenomena, at the bottom of the patterns than at the surface of the resin. The entire zone to be irradiated is then effectively irradiated and foot formation is avoided.

Optionally the method comprises at least any one of the following optional characteristics:

The masking coating covers all the resin situated outside the patterns as well as at least part of the sidewalls of the patterns, so that the covered part of the sidewalls extends beyond the masking coating covering the resin outside the patterns.

Preferably, the masking coating covers the sidewalls of the pattern over a height greater than the thickness of the masking coating. Preferably, the height covered by the masking coating is at least equal to 1.5 times or even two times the thickness of the layer forming the masking coating. The thickness of this layer is taken over a zone devoid of patterns. The covered height, for example, is measured from the face of the masking coating turned toward the resin.

The part of the masking coating that covers the sidewalls of the patterns extends in a direction substantially parallel to the patterns. If the patterns form trenches exhibiting sidewalls substantially perpendicular to the plane of the substrate, this portion of masking coating then also extends in a direction substantially perpendicular to the plane of the substrate.

Preferably, for each pattern, the masking coating covers the sidewalls of the pattern over a height approximately equal to one third of the width of the pattern. Advantageously, during the exposure step, for each pattern the sidewalls of the pattern are covered over a height at least equal to one half of the width of the pattern.

Preferably, the masking coating covers the entire surface of the resin outside the end of the patterns and possibly of a part of the sidewalls of the patterns.

Advantageously, the coverage of the sidewalls by the masking coating makes it possible to achieve a better aspect ratio and to obtain narrow patterns while limiting the formation of feet in the bottom of the patterns.

In certain non-limitative embodiments, the masking coating covers at least 20% of the height of the pattern. Still more advantageously, the masking coating covers at least 50% or even at least 80% of the height of the pattern.

Preferably, the masking coating covers the entire surface of the mold outside the end of the reliefs and possibly of a part of the sidewalls of the reliefs.

The masking coating has an internal face turned toward the resin at least during the pressing step. At least during the pressing step, the masking coating in contact with the sidewalls of the patterns extends beyond the said internal face.

Preferably, the irradiation step is a step of optical irradiation. Alternatively, this step is a step of exposure to a flux of electrons and/or ions. According to another alternative, the resin is exposed by a step of optical irradiation and by a step of exposure to a flux of electrons and/or ions.

The method comprises a step of development of the resin after the steps of irradiation and stripping of the mold. Thus, in the case of a positive resin, the residues of resin situated in the bottom of the trenches are eliminated and the substrate is bared.

In a first embodiment, when the masking coating is applied on the resin before the step of pressing of the mold, the reliefs of the mold pass through the masking coating and penetrate into the resin during the pressing step.

The irradiation step is performed after the step of stripping of the mold. For this purpose a mold made of an opaque material is preferably provided. Alternatively, the irradiation step may be performed before the step of stripping of the mold if the latter is transparent to the irradiating radiation.

The method comprises a step of development of the resin after the steps of irradiation and of stripping of the mold, in which the masking coating is developable and disappears during the step of development of the resin. Advantageously, the residues of resin situated in the bottom of the patterns are eliminated along with the masking coating in the course of the same development step. Alternatively, the development step causes the irradiated resin to disappear during the irradiation step and leaves the masking coating in place.

The thickness of the resin is at least three times greater than the thickness of the masking coating. Preferably, the height of the patterns is at least two times greater than the thickness of the masking coating. Preferably, the height of the reliefs is at least two times greater than the thickness of the masking coating. Preferably, the reliefs penetrate approximately at least one times the thickness of the masking coating beyond the uncovered surface of the masking coating. These relative dimensions permit good penetration of the reliefs and good release of the masking coating.

The resin has a positive nature. In an advantageous embodiment, the resin is of CR01P type and the masking coating is of Barc DUV30. In another advantageous embodiment, the resin is of M78Y type and the masking coating is of AlSi. In a first embodiment, the mold is made of a material that allows the radiation to pass at least partly during the irradiation step. The masking coating is then applied on the mold before pressing of the mold into the resin, and the irradiation step is performed before the stripping step and through the mold. Preferably, the masking coating is disposed on the face of the mold intended to be pressed against the resin. In this way the mold is associated with the masking coating. A single pressing step makes it possible to imprint the reliefs and at the same time to apply on the resin a mask that blocks the radiation on zones defined by the masking coating.

Preferably, a step of heating of the resin is performed prior to the step of pressing of the mask. This heating step facilitates penetration of the mold into the resin. The heating temperature is higher than or equal to the glass transition temperature of the resin but remains lower than its deprotection temperature.

After the pressing step and after the irradiation step, a step of development of the resin is performed to remove the residues of resin. Preferably, this development step is performed with preliminary baking. Alternatively it is performed without preliminary baking.

The masking coating is formed by a single layer or by a plurality of layers. Advantageously, the masking coating is of chrome.

The masking coating may be covered with an antiadhesive material if necessary to facilitate stripping of the mold.

The masking coating is applied on the mold so as to leave the reliefs uncovered at least at their end, in order to permit irradiation of the resin through the reliefs of the mold. If only the end of the relief is left uncovered, particularly good resolution of the patterns will be achieved.

The lateral sidewalls of the reliefs are covered at least partly by the masking coating. Then, after irradiation and development of the resin, a substantially trapezoidal pattern is obtained, and more generally a pattern having larger dimension at the bottom of the resin than at the surface of the resin, thus forming a cavity in the bottom of the patterns. That has the advantage of facilitating a subsequent operation, usually designated by the English term "lift-off" and which consists of forming a pattern by means of lifting while dissolving an underlying layer. The production of certain structures necessitates depositing a layer of metal, for example, in the bottom of the patterns of the resin. For this purpose, according to the known methods, a layer of metal is disposed over the entire surface of the resin and directly below openings. In certain cases, the layer of metal may adhere at least partly to the sidewall of the patterns, thus preventing appropriate deposition in the bottom of patterns directly below the opening. The existing methods provide a subsequent step of stripping the resin, in the course of which the metal present at the surface of the resin is removed, leaving only the metal present at the bottom of openings. In the cases in which part of the layer of metal adheres to the sidewalls or is not correctly positioned on the bottom of the pattern, the final result is unsatisfactory.

The method according to the invention, by forming cavities in the bottom of the patterns, favors rupture of the layer of metal at the bottom of the patterns and correct deposition of the metal on the bottom of the pattern directly below the opening. The metal does not cover the entire surface of the cavity but does indeed cover the entire zone situated directly below the opening. The subsequent step of stripping of the resin also removes the metal present at the surface of the resin and leaves only the metal present at the bottom of the openings. The final result is significantly improved compared with the known methods.

Another object of the invention is a multilayer assembly comprising a substrate, a layer of photosensitive resin covering the substrate and able to be activated when it is irradiated by radiation having a given wavelength range, and comprising a masking coating covering the layer of resin, stopping the said radiation and formed to split, be detached or be absorbed locally when it is pressed by at least one relief applied on its uncovered surface and penetrating into the layer of resin.

Another object of the invention is a mold for a nanoimprint lithography method, provided with a substrate transparent to optical radiation, a lower face equipped with at least one relief having sidewalls and an end, a masking coating applied on the mold and configured to stop the optical radiation, the masking coating being disposed so as to stop the optical radiation outside of the at least one relief. Preferably, the masking coating is formed to also stop the optical radiation over at least part of the sidewalls of the at least one relief.

The masking coating stops the optical radiation outside of the at least one relief and allows the radiation to pass at the reliefs. Thus it leaves the end of the at least one relief uncovered. According to a first variant of this embodiment, the masking coating covers the entire height of the sidewalls of the pattern and leaves only the end of the patterns uncovered. According to a second variant of this embodiment, the masking coating leaves the sidewalls of the relief uncovered over only part of their height.

Preferably, the masking coating covers the sidewalls of the relief over a height greater than the thickness of the masking coating. Preferably, the height covered by the masking coating is at least equal to two times the thickness of the layer forming the masking coating. The thickness of this layer is taken over a zone of the mold devoid of reliefs.

Advantageously, the coverage of the sidewalls by the masking coating makes it possible to achieve a better aspect ratio and to obtain narrow patterns, while limiting foot formation in the bottom of the patterns.

Advantageously, the masking coating covers at least 20% of the height of the relief. Still more advantageously, the masking coating covers at least 50% or even at least 80% of the height of the relief.

Preferably, the masking coating covers the entire surface of the mold outside the end of the reliefs and possibly of a part of the sidewalls of the reliefs.

Preferably, the masking coating is covered by an anti-adhesive material. This characteristic makes it possible to facilitate stripping of the mold.

Another object of the invention is a method for manufacturing a mold according to any one of the embodiments of the invention. This method comprises a step of masking to cover a face of a substrate transparent to optical radiation with a masking coating stopping the optical radiation, at least one step of partial stripping to remove the masking coating partly in order to define, on the substrate, at least one zone corresponding to a relief that is not covered by the masking coating and through which the optical radiation is able to pass through the mold.

Optionally, the manufacturing method comprises at least one of any of the following optional characteristics:

Prior to the masking step, the method comprises a step of obtaining at least one relief on the said face of the substrate in order to form a base mold and the step of partial stripping consists of removing the masking coating at least at the ends of the said at least one relief. Optionally, the step of partial stripping removes the masking coating only at the end of the at least one relief, and the method comprises a step of extending the said at least one relief, the extension step comprising a sub-step consisting of covering the masking coating and the at least one relief by an additional material transparent to the optical radiation, a sub-step of lithography consisting of removing the additional material outside the at least one relief and of preserving it at least at one relief in order to form an extension of the at least one relief. Preferably, this method comprises a step consisting of adjusting the height of the extension. Preferably, this adjustment step results from mechano-chemical planarization or polishing.

After the step of partial stripping, the method provides a step of covering the substrate at the said uncovered zone and the masking coating by an additional material transparent to the optical radiation, and comprises a step of lithography to form in the additional material at least one relief at the said zone that is not covered by the masking coating.

Other characteristics, objectives and advantages of the present invention will become apparent upon reading the detailed description hereinafter with reference to the attached drawings, provided by way of non-limitative examples and wherein:

FIG. 1 shows the general principle of the method of nanoimprint lithography and irradiation according to the invention.

FIGS. 2a to 2f describe a first embodiment of the invention in which the masking coating of the underlying photosensitive resin is deposited on the resin itself.

FIGS. 3a to 3d describe a second embodiment of the invention in which the optical mask is an integral part of the imprint mold.

Figure 4A:
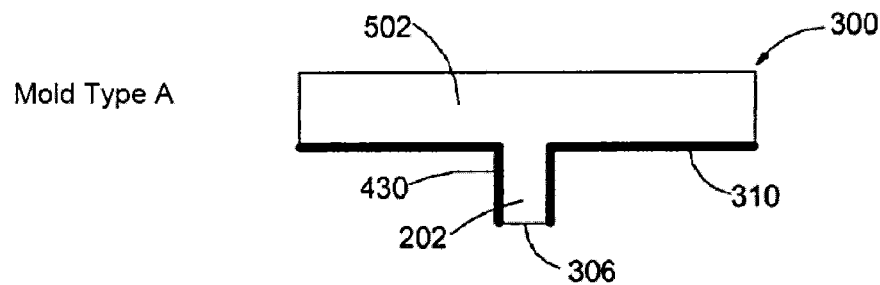
Figure 4B:
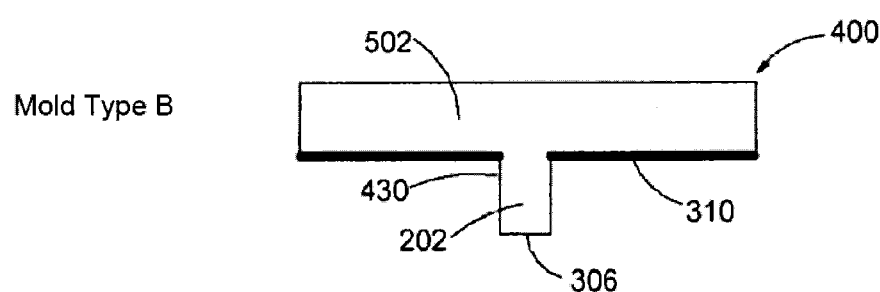
Figure 4C:
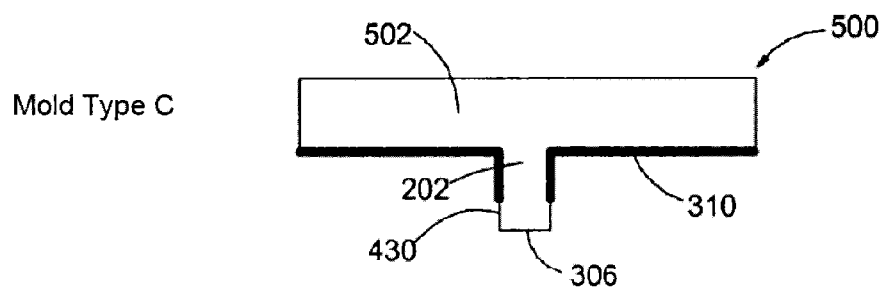

FIGS. 4a, 4b and 4c show different structures of molds that may be used for employment of the second embodiment in which the resin used is positive.

FIGS. 5a to 5e describe the manner in which a mold of type A is obtained.

FIGS. 6a to 6g describe the steps of the manner in which a mold of type B is obtained.

FIGS. 7f to 7i describe the supplementary steps of the embodiment of a mold of type C compared with those of a mold of type A.

The attached drawings are provided by way of examples and are not limitative of the invention.

FIG. 1 shows the general principle of the method of nanoimprint lithography and irradiation according to the invention. In this method the imprinting of patterns takes place from a mold into a photosensitive resin 120, which will have been deposited beforehand on substrate 130 to be etched. Photosensitive resin 120 is of positive nature. Preferably, a pattern forms a hollow in the resin. The invention provides that an optical mask, in the form of a completely or partly opaque layer, is also present. Depending on the different embodiments of the invention described in the figures hereinafter, the mask will have been deposited and formed on the layer of resin or will be an integral part of a transparent mold.

The invention does not advance any hypothesis as to the manner of deposition of the resin and if applicable of the mask. All of the techniques known and employed in particular by the microelectronics industry are eligible for use, from the simplest such as deposition by centrifuging or "spin-coating", often used for deposition of photosensitive resins, to the most elaborate of deposition techniques, for example in a confinement chamber by thermal evaporation of an appropriate material, under vacuum or in the presence of reactive gases. This layer forming the optical mask will be referred to hereinafter as masking coating 110.

The etching of the substrate, the final objective of any photo-etching operation, is not otherwise described. In this case also, all the techniques employed by the microelectronics industry for etching substrates in each of the very numerous steps of production of numerous types of devices produced by this industry: integrated circuits, optoelectronic components, mechanical nanostructures and others, are possible.

The optimization of the opacity of the mask for underlying resin layer 120, subjected to irradiation from a light source through a transparent mold or in the air, will be possible by using all the calculation methods developed for stratified optical devices of the Fabry-Perot interferometer type 104 well known by the specialists in this field. Upper layer 102 to be considered is air or the transparent material in which the imprint mold is manufactured, depending on one or the other of the embodiments described hereinafter. Reflection and transmission coefficients will be easily established, especially as a function of the thickness and composition of the layer forming masking coating 106, thus permitting its optimization in order that the energy dose received by the resin in the zones kept protected by the mask can be maintained below a threshold value characteristic of the resin being employed. This value is lower than a threshold generally referred to by the English term "dose to clear", meaning the dose necessary for transformation of the resin in order to achieve a change in its behavior. Thus, to the extent that this threshold is not crossed, that guarantees that a resin of positive nature, initially insoluble, will remain insoluble, and that a resin of negative nature will remain soluble after the irradiation operation described hereinafter.

Figure 2A:
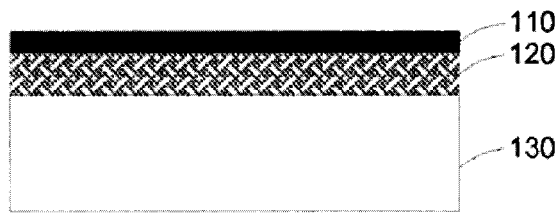

FIGS. 2a to 2f describe a first embodiment of the invention. In this embodiment, masking coating 110 of underlying photosensitive resin 120 is deposited on resin 120 as illustrated in FIG. 2a.

Figure 2B:
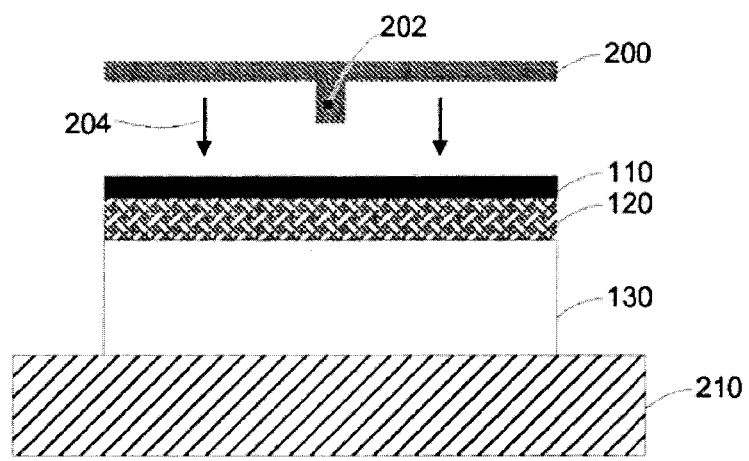

As illustrated schematically in FIG. 2b, it is this stack of layers that will be imprinted by pressing of mold 200, into which all reliefs 202 to be reproduced have been etched.

Prior to the imprinting operation, which demands that a strong pressure 204 be exerted to imprint reliefs 202 of mold 200 in order to form patterns 230 in the layer of resin 120, through masking coating 110, substrate 130 will be placed on an adequate heating apparatus 210 until superficial layers 110, 120 acquire a temperature suitable for favoring the pressing operation while remaining below the temperature of "deprotection" of resin 120, which would make it unusable. Advantageously, the heating temperature will be higher than or equal to the glass transition temperature of the resin.

Within the scope of the present invention, and for all described embodiments, both protrusions and hollows are designated as relief(s) and pattern(s). A given mold and a given layer of resin may exhibit one or more protrusions and one or more hollows. Preferably, and as illustrated, the relief of the mold forms a protrusion and the pattern imprinted in the resin forms a hollow in the resin corresponding to the relief of the mold, as illustrated in the figures.

Figure 2C:
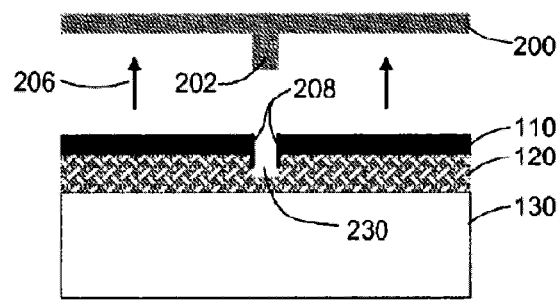

FIG. 2c shows the result of the imprinting operation after substrate 130 and the layers of resin 120 and of masking 110 have been allowed to cool to permit stripping 206 of mold 200 without deformation of patterns 230 imprinted in resin 120. In this first embodiment, mold 200 therefore also serves to form masking coating 110 by perforating corresponding layer 110. The material constituting it is therefore chosen not only to satisfy the optical properties discussed in the foregoing but also to have the mechanical properties that permit its deformation without damage to the integrity of patterns 230. Masking coating 110 will advantageously be a metal layer or a stratified assembly of materials sufficiently ductile that most of the perforated parts fold over the sidewalls of patterns 208, leaving little or no residues in the bottom of the imprinted patterns. It will be advantageously possible to optimize the relative thicknesses of the resin and of the masking coating in order that, depending on the size of the patterns and on the applied pressure, the rupture of the masking layer is optimized. It will also be possible to influence the shape of the patterns, by using trapezoidal or even triangular patterns.

Figure 2D:
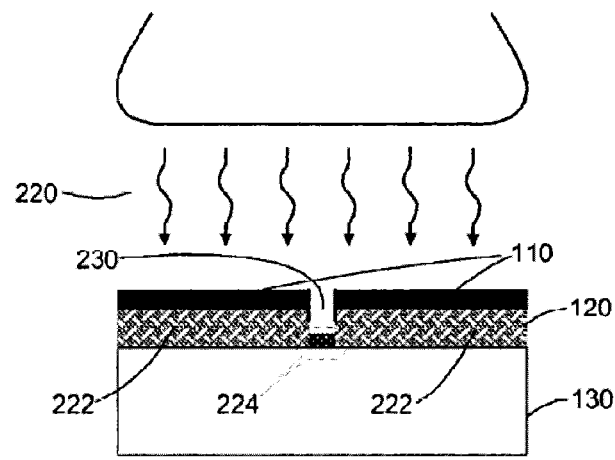

During the pressing step, part of masking coating 110 tears under the effect of penetration of reliefs 202 of mold 200. Locally, masking coating 110 becomes deformed and takes on the shapes of reliefs 202. In this way, as illustrated in FIGS. 2c and 2d, masking coating 110 covers the sidewalls of reliefs 202 as well as the sidewalls of patterns 230 defined by reliefs 202.

Masking coating 110 therefore extends over the sidewalls of the patterns for a height greater than the thickness of the layer forming masking coating 110. This thickness may be measured prior to the pressing step or between two patterns, where masking coating 110 is not deformed during the pressing step.

Preferably, this height of coverage of the sidewalls is greater than one third of the width of the patterns. The width of the patterns is taken in a direction substantially parallel to the surface of the layer of resin or of the layer of masking coating 110. Even more preferably, the height covered by the sidewalls is approximately one half of the width of the patterns.

Masking coating 110 has an external face and an internal face turned respectively toward the exterior and toward the interior of the multilayer assembly. After perforation, the portions of masking coating 110 in contact with the sidewalls extend beyond the internal face.

Typically, and without being limitative, the thickness of masking coating 110 is between 5 nm and 100 nm. Care will be taken to adapt the thickness as a function of the material of the masking coating, of the depth of the resin, of the dimensions of the pattern, etc.

As regards the minimum thickness, this layer must in any case be thick enough to assure its role of mask and to absorb the UV radiation sufficiently that the underlying resin is not made soluble and then developed.

As regards the maximum thickness, it must not be too large, in order to permit perforation thereof during deep-drawing. It must be sufficiently thin relative to the dimensions of the pattern that it is found not at the bottom of the hole after deep-drawing but definitely on the sidewalls.

FIG. 2d describes the next operation in which multilayer assembly 110, 120, 130 is exposed over its entire surface to light radiation 220, the wavelength of which is adapted to the type of photosensitive resin used. That may be, for example, ultraviolet radiation. Exposure to a flux of electrons or ions may be envisioned. As discussed in the foregoing, the parts of masking coating 110 that remain in place after imprinting protect underlying resin 120 sufficiently throughout the entire duration of irradiation. The behavior of resin 120 is not modified in those zones 222 covered by masking coating 110. Only the parts of the resin that were compressed by reliefs 202 of mold 200 in the course of the pressing step are exposed directly to the light radiation. Those zones 224 that were not covered by masking coating 110 receive a radiation dose sufficient to cross the threshold mentioned hereinabove where the behavior of the resin is modified, thus permitting its elimination in the next step.

It will be noted that resin 120 employed is of the type known as positive. Since a resin of positive nature is initially insoluble, its exposure beyond the transformation threshold makes it soluble, thus permitting, as desired, its elimination in the next step, the result of which is described with FIG. 2f or 2e. It will also be noted that the small amount of residues resulting from perforation of masking coating 110 and that could be present at the bottom of patterns 230 is not able to prevent satisfactory irradiation of these patterns.

It will also be noted that mold 200 is not necessarily transparent in this embodiment of the invention, since mold 200 is stripped prior to irradiation. Optionally, however, mold 200 may be made of a transparent material, in which case the irradiation of resin 120 will also be possible prior to stripping of mold 200.

The last step consists in developing resin 120, in other words making it soluble where it has been exposed to sufficient radiation. The unexposed parts 222 of resin remain in place to permit etching of substrate 130 after the resin compressed at the bottom of patterns 230 has been eliminated, thus solving the problem constituting the object of the invention. This step may necessitate preliminary baking.

Figure 2F:
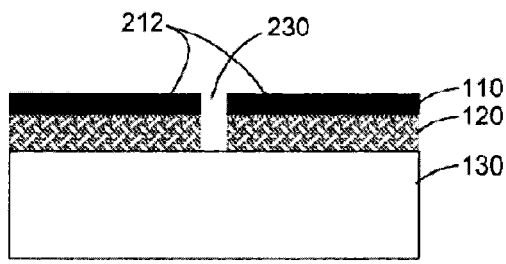

Finally it will be noted, as shown in FIG. 2f, that parts 212 of masking coating 110 that were not perforated by the mold may optionally remain in place without inconvenience for etching of substrate 130. That, according to the materials used for this layer and the possibility or impossibility of eliminating it during the preceding operation of development of the resin.

The table below presents two examples of materials and thicknesses used to achieve this first embodiment of the invention:

| | Masking coating: | | Resin: | |
|---|---|---|---|---|
| | material | thickness | material | thickness |
| Ex. No. 1 | BARC DUV30 | 45 nm | CR01P | 140 nm |
| Ex. No. 2 | AlSi | 20 nm | M78Y | 800 nm |

As regards the masking coating:
The material named BARC, from the English "bottom anti-reflective coating", is an anti-reflective coating product widely used in photolithography by the entire microelectronics industry; this product is commercially available under the trade name DUV30 from specialized suppliers such as Brewer Science, Inc.
In Example No. 2, the masking coating is made of an alloy of aluminum (Al) and silicon (Si).
In both examples, the positive resins used are also products widely used in photolithography: CR01P resin is commercially available from Tokyo Ohka Kogyo CO., Ltd, and M78Y resin from JSR Electronics NV.

FIGS. 3a to 3d describe a second embodiment of the invention, in which masking coating 310 is an integral part of the mold.

In this case, a mold 300 which is made of a transparent material 302, also referred to as base mold 302, 502, is used. To obtain a result similar to what is described in FIG. 2 without having to deposit a masking coating above the resin, this coating is placed on base mold 302 itself. Masking coating 310 of mold 300 covers all of the parts that must be opaque in order to protect, as in the foregoing, the underlying resin on the substrate. In the case of use of a resin of positive nature, only ends 306 of reliefs 202 of mold 300 are not covered by masking coating 301.

Figure 3A:
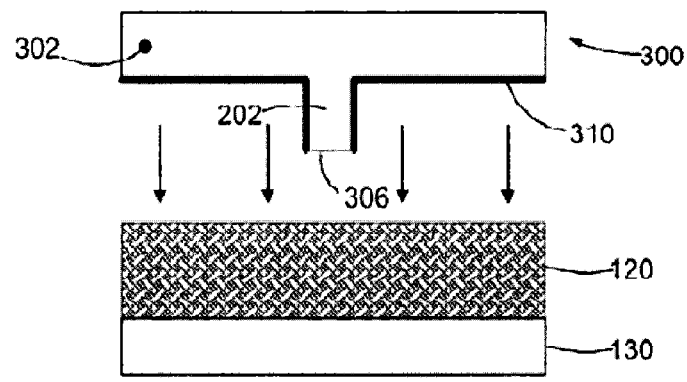
Figure 3B:
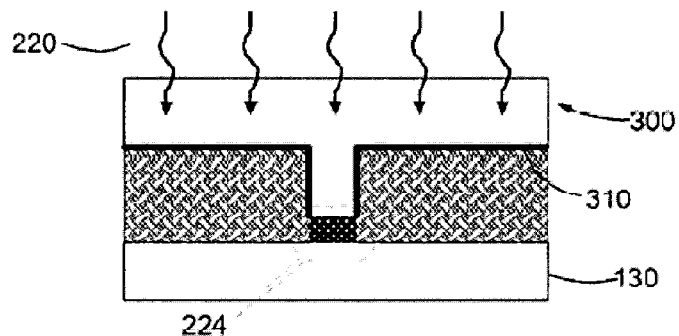

The imprinting operation is carried out as in the foregoing, but in resin 120 only. As shown in FIG. 3b, parts 224 of resin 120 compressed by mold 300 are then irradiated 220 beyond their transformation threshold through the transparent mold, which remains in place for this operation, since it also functions as mask for non-irradiated parts 222 of resin 120. As in the foregoing, and under the same conditions, resin 120 may be heated to facilitate the imprinting of patterns.

Figure 3C:
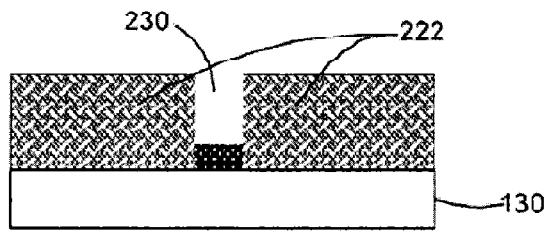

After stripping of mold 300, resin 120 remains in place, as illustrated in FIG. 3c. Compressed parts 224, which were irradiated and made soluble, may then be developed and eliminated under the standard conditions of traditional optical lithography. Chemical development is provided, for example, for removing the residues, with or without preliminary baking.

Figure 2E:
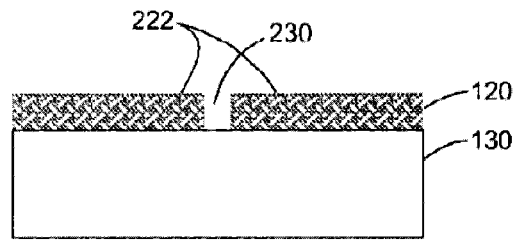
Figure 3D:
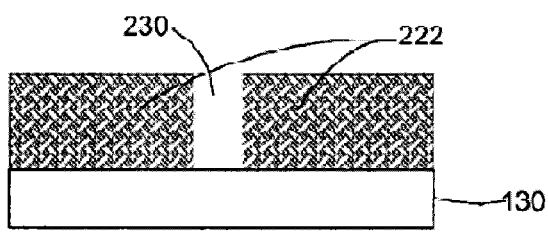

The final result corresponds to FIG. 3d and to the preceding FIGS. 2e and 2f, which show that the imprinting residues have been eliminated at the bottom of patterns 230 and that it is possible to proceed directly to etching of the substrate without having to resort to the step of reactive ion etching known as RIE mentioned in the introduction about the prior art.

FIGS. 4a, 4b and 4c show different structures of molds that may be used to employ the second embodiment described in reference to FIGS. 3a to 3d. This embodiment preferably provides the use of a positive resin. Each of these molds 300, 400, 500 combines a transparent substrate 502 and a masking coating 310 that blocks the radiation.

For comparison, FIG. 4a again shows the structure of the mold used in FIG. 3, where only ends 306 of reliefs 202 of mold 300 are not masked by masking coating 310. This mold is referred to as being of type A in the description of the invention hereinafter. This mold is particularly advantageous for obtaining very fine patterns.

FIG. 4b shows that it is also possible not to mask sidewalls 430 of reliefs 202 of mold 400.

Mold 500 illustrated in FIG. 4c is an advantageous embodiment in which only part of sidewalls 430 of reliefs 202 is masked.

Sidewalls 430 of relief 202 of mold 500 of type C illustrated in FIG. 4c are only partly devoid of masking coating 310, the portion of sidewalls 430 devoid of masking coating 310 extending from end 306 of relief 202.

Preferably, masking coating 310 covers sidewalls 430 of relief 202 over a height greater than the thickness of masking coating 310. Preferably, the height covered by masking coating 310 is at least equal to 1.5 or even to two times the thickness of the layer forming masking coating 310. The thickness of this layer is taken over a zone of the mold devoid of reliefs.

Masking coating 310 has an external face and an internal face turned respectively toward the exterior and toward the interior of mold 500. The portions of masking coating 310 in contact with the sidewalls extend beyond the external face.

By way of non-limitative example, the thickness of the layer forming masking coating 310 is between 5 nm and 1 micron.

As regards the minimum thickness, this layer must in any case be thick enough to assure its role of mask and to absorb the UV radiation sufficiently in order that the underlying resin is not made soluble and then developed. This minimum thickness therefore depends on the nature of the material and the intensity of the radiation.

Concerning the maximum thickness, care will be taken that it permits the material of masking coating 310 to be deposited uniformly, the thickness being limited by the depth of the pattern to be produced.

Advantageously, the coverage of the sidewalls by masking coating 310 makes it possible to achieve a better aspect ratio and to obtain narrower patterns than with a mask in which the sidewalls are not covered, while at the same time limiting foot formation in the bottom of the patterns.

The mold of 4c also makes it possible to facilitate the production of patterns of trapezoidal shape and more generally having a larger dimension at the bottom of the patterns than at the surface of the resin, which proves particularly advantageous, as indicated in the foregoing.

Advantageously, masking coating 310 covers at least 20% of the height of the relief. Still more advantageously, masking coating 310 covers at least 50% or even at least 80% of the height of the relief.

In addition, the production of this type of mold may be facilitated by using, for example, a technique of spraying the material forming the masking coating in a direction oblique to the normal to the substrate.

Preferably, masking coating 310 in each of these molds covers the entire mold outside reliefs 202.

FIGS. 5a to 5e describe an example of the manner in which a mold A is obtained.

Figure 5A:
Figure 5B:
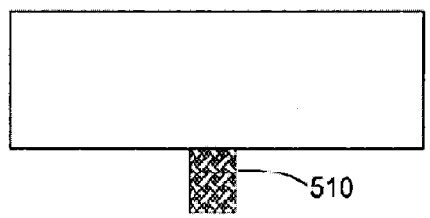
Figure 5C:
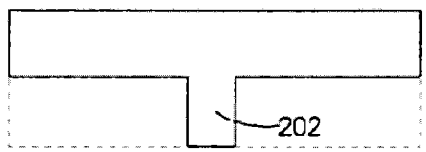

This type of mold is manufactured in a block 501 of transparent material, for example of quartz, in which reliefs 202 of the mold will be formed with the traditional methods of lithography. For this purpose resin 510 is deposited and the reliefs are defined. Then a step of etching and if necessary a step of cleaning of block 501 is carried out in order to obtain a standard mold of NIL type. This etching step is illustrated in FIG. 5c.

Figure 5D:
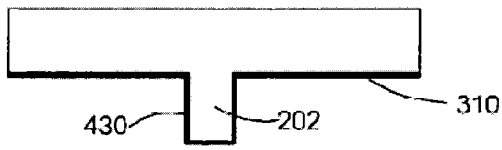
Figure 5E:
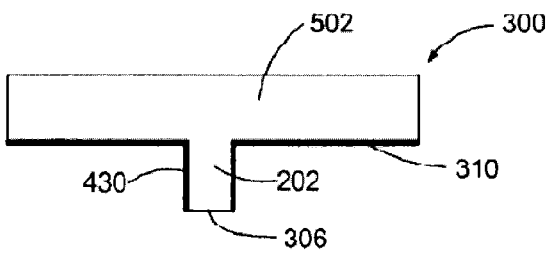

One layer or a combination of layers of one or more materials constituting opaque masking coating 310 is deposited in one or more steps over the entire etched surface of the base mold, etched so as to obtain a homogeneous thickness, including over sidewalls 430 of reliefs 202. The etched and covered mold illustrated in FIG. 5d is then obtained. The deposited material is chrome, for example.

In order to obtain a mold of type A, it is then sufficient to remove masking coating 310 on ends 306 of reliefs 202. This operation is performed simply by using one or the other of the polishing methods commonly used by the microelectronics industry to abrade and polish the substrates and especially by having recourse to the traditional type of polishing referred to as mechano-chemical known under the abbreviation CMP, for the English "chemical mechanical polishing". In this way a mold 300 is obtained by association of a transparent substrate 502 and a masking coating 310.

FIGS. 6a to 6g describe the steps of the method for obtaining a mold of type B.

Figure 6A:
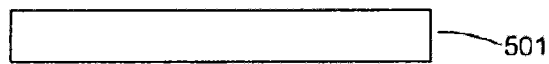
Figure 6B:
Figure 6C:

As for the foregoing mold, the starting material is a transparent block 501, for example of quartz, on which there is deposited the layer or the combination of layers 610 that will constitute opaque masking coating 310, as illustrated in FIGS. 6a and 6b. The mask layer will be made of chrome, for example.

Figure 6D:

Traditional operations 620 of photolithography and etching then make it possible to open the mask layer at positions 630, where reliefs 202 of mold 400 must be formed, as illustrated in FIGS. 6b and 6d.

Figure 6E:

The next operation consists of depositing a transparent additional material 640, for example of silicon oxide, by means of one or the other of the deposition methods commonly used by the microelectronics industry, as illustrated in FIG. 6e. Preferably, transparent additional material 640 covers the entire surface.

Figure 6F:
Figure 6G:
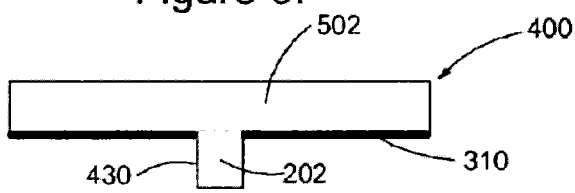

The second transparent material is then removed 650 by lithography and etching to create reliefs 202 of mold 400 directly below openings 630 created previously in mask layer 610. These steps are illustrated in FIGS. 6f and 6g.

In this way a mold 400 of type B is obtained. Sidewalls 430 of reliefs 202 are not covered by masking coating 310.

FIG. 7 describes the steps of an example of the method for obtaining a mold of type C.

Once again, the starting material is a transparent block, for example of quartz. The operations corresponding to FIGS. 5a to 5e, and therefore to the production of a mold 300 of type A, are identical for production of a mold of type C. This is therefore equivalent to starting from a mold 300 of type A and adding the steps of FIGS. 7f to 7i.

Figure 7F:
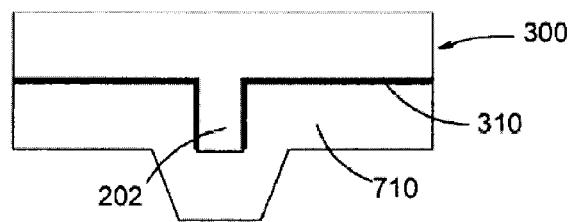

The first of these additional steps consists in deposition of a transparent additional material 710, for example of silicon oxide, on the face of the mold covered by masking coating 310. This step is illustrated in FIG. 7f.

Thereafter traditional operations of photolithography and etching make it possible to leave second layer 710 of transparent material in place on all of the reliefs 202 of the mold.

Figure 7G:
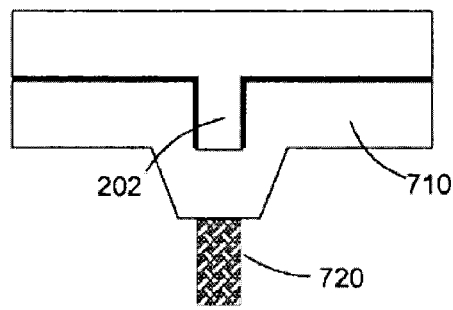
Figure 7H:
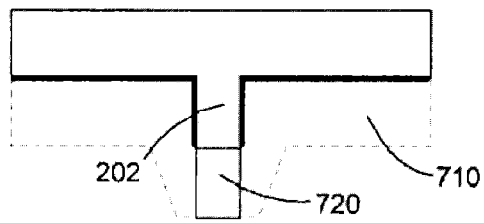
Figure 7I:
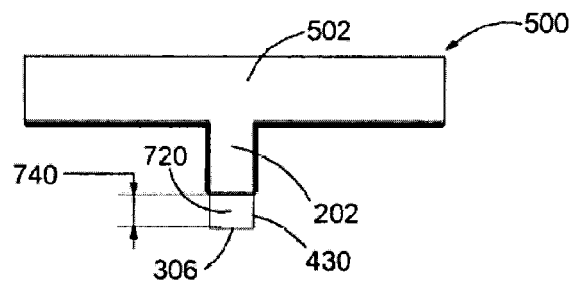

In particular, these steps comprise the formation of an extension relief 720 in a resin, these extension reliefs extending directly below reliefs 202 formed in base mold 502. The formation of this extension relief 720, obtained by lithography, etching and cleaning, is illustrated in FIGS. 7g and 7h. The etching step of FIG. 7h is intended to eliminate second layer 710 outside the relief.

Reliefs 202 of final mold 500 are therefore constituted by superposition of the reliefs of mold 300 of type A obtained at the end of steps 5a to 5e and of extension reliefs 720.

The reliefs obtained from steps 5a to 5e have their sidewalls covered with masking coating 310. The sidewalls of extension reliefs 720 are not covered with masking coating 310.

In this way there is obtained a mold 500 of type C, where height 740 of extension reliefs 720 may be adjusted, for example with mechano-chemical polishing, thus controlling the height of the sidewalls not covered by masking coating 740. Mold 500 obtained in this way therefore exhibits reliefs 202 where only part of sidewalls 430 is covered by a masking coating 310.

Each of molds 300, 400, 500 is therefore obtained by combining a substrate that allows the radiation to pass and a masking coating 310 that blocks this radiation at least partly.

In all of the described embodiments, masking coating 310 may be a monolayer or multilayer coating.

In each of the embodiments it will be possible, by choosing a suitable resin, to replace the step or steps of optical irradiation by exposure to a flux of electrons or ions.

Advantageously, the invention makes it possible to eliminate the residues of resin after nanoimprinting. In addition, it permits the formation of nanometric patterns having a high aspect ratio, which is the ratio between the height and width of the pattern. The invention is also particularly simple and inexpensive to set up, the production cost of the molds indeed remaining limited.

The invention is not limited to the described embodiments but extends to any embodiment in conformity with its spirit.

The invention claimed is:

1. A nanoimprint lithography method, comprising:
pressing a mold comprising reliefs having sidewalls and ends into a masking coating and a photosensitive resin, wherein the masking coating is disposed on the photosensitive resin and the photosensitive resin is disposed on a substrate, thereby forming patterns having sidewalls and ends, defined by the reliefs, in the masking coating and the photosensitive resin, wherein the masking coating covers all the photosensitive resin outside the patterns and at least part of the sidewalls of the patterns and leaves at least the ends of the patterns uncovered;
separating the mold from the masking coating and the photosensitive resin; and,
before or after the separating, exposing the photosensitive resin, to activate the photosensitive resin.

2. The method of claim 1, wherein the masking coating covers the side-walls of the patterns at a height greater than a thickness of the masking coating on the photosensitive resin.

3. The method of claim 1, further comprising, after said exposing:
developing the photosensitive resin.

4. The method of claim 3, wherein, during the developing, the masking coating develops and disappears.

5. The method of claim 1, wherein the exposing is performed after the separating.

6. The method of claim 1, wherein the exposing is performed before the separating and wherein the mold is made of a transparent material.

* * * * *